(12) United States Patent
Park et al.

(10) Patent No.: US 10,355,184 B2
(45) Date of Patent: Jul. 16, 2019

(54) LIGHT-EMITTING DIODE PACKAGE

(71) Applicant: SEOUL VIOSYS CO., LTD., Ansan-si (KR)

(72) Inventors: Jun Yong Park, Ansan-si (KR); In Kyu Park, Ansan-si (KR); Yeo Jin Yoon, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/758,302

(22) PCT Filed: Sep. 7, 2016

(86) PCT No.: PCT/KR2016/010020
§ 371 (c)(1),
(2) Date: Mar. 7, 2018

(87) PCT Pub. No.: WO2017/043859
PCT Pub. Date: Mar. 16, 2017

(65) Prior Publication Data
US 2018/0261739 A1 Sep. 13, 2018

(30) Foreign Application Priority Data
Sep. 8, 2015 (KR) .................. 10-2015-0127061

(51) Int. Cl.
*H01L 23/31* (2006.01)
*H01L 25/16* (2006.01)
(Continued)

(52) U.S. Cl.
CPC .......... *H01L 33/60* (2013.01); *H01L 23/3114* (2013.01); *H01L 25/167* (2013.01);
(Continued)

(58) Field of Classification Search
CPC .......... H01L 33/60; H01L 33/46; H01L 33/62; H01L 33/64; H01L 2224/49091; H01L 2224/48111; H01L 25/167; H01L 23/3114
See application file for complete search history.

(56) References Cited

U.S. PATENT DOCUMENTS

2005/0236638 A1* 10/2005 Tsukagoshi ........... H01L 33/486
257/99
2007/0164454 A1* 7/2007 Andrews ................. H01L 33/62
257/783
(Continued)

FOREIGN PATENT DOCUMENTS

| JP | 2008-186796 A | 8/2008 |
|---|---|---|
| JP | 2011-003798 A | 1/2011 |

(Continued)

OTHER PUBLICATIONS

International Search Report in PCT/KR2016/010020, dated Dec. 22, 2016.

*Primary Examiner* — Galina G Yushina
(74) *Attorney, Agent, or Firm* — Perkins Coie LLP

(57) ABSTRACT

A light-emitting diode package comprising: a substrate having one or more first pads, one or more second pads, a first terminal, and a second terminal, which are all formed on the upper surface; a plurality of light-emitting diode chips loaded on the one or more first pads and electrically connected to the first pad and the second pad; and a reflector coupled to an upper part of the substrate and having an opening part through which the plurality of light-emitting diode chips is exposed, wherein the first pad is formed as one body with the substrate, and the first terminal or the second terminal are connected to an external power source and formed to have a predetermined height at the upper surface of the substrate.

19 Claims, 9 Drawing Sheets

(51) Int. Cl.
  *H01L 33/60*   (2010.01)
  *H01L 33/46*   (2010.01)
  *H01L 33/62*   (2010.01)
  *H01L 33/64*   (2010.01)

(52) U.S. Cl.
  CPC .............. *H01L 33/46* (2013.01); *H01L 33/62* (2013.01); *H01L 33/64* (2013.01); *H01L 2224/48091* (2013.01); *H01L 2224/48111* (2013.01)

(56) References Cited

U.S. PATENT DOCUMENTS

2016/0165680 A1* 6/2016 Johnson ............... H05B 33/083
  315/51
2016/0273741 A1* 9/2016 Jung ................... F21V 19/0055

FOREIGN PATENT DOCUMENTS

| JP | 2015-011840 A | 1/2015 |
| KR | 10-1255671 B1 | 4/2013 |
| KR | 10-2014-0127063 A | 11/2014 |

\* cited by examiner (a)

(b)

(c)

(d)   (e)

LIGHT-EMITTING DIODE PACKAGE

CROSS-REFERENCE TO RELATED APPLICATION(S)

The present application claims the priority to and benefits of PCT Application No. PCT/ KR2016/010020, filed on Sep. 7, 2016, which further claims priority to Korean Patent Application No. 10-2015-0127061, filed Sep. 8, 2015. The above patent documents are incorporated herein by reference for all purposes.

TECHNICAL FIELD

Exemplary embodiments of the present invention relate to a light emitting diode package, and, more particularly, to a light emitting diode package which includes a plurality of UV light emitting diode chips mounted on a substrate to provide high output.

BACKGROUND ART

A light emitting diode refers to an inorganic semiconductor device that emits light through recombination of electrons and holes. Such light emitting diodes have advantages such as eco-friendliness, low power consumption, long lifespan, low price, and the like. Among the light emitting diodes, UV light emitting diodes can be applied to UV curing, sterilization, white light sources, medicine, and equipment components. Particularly, a UV curing apparatus utilizes chemical reaction in which curing is performed by irradiating an object to be cured, for example, paint applied to a surface of a product, with UV light, and is used in various fields such as semiconductors, electronics, medicine, communication, and the like.

However, products employing UV light emitting diodes are more likely to suffer from deterioration in lifespan due to heat generated from the UV light emitting diodes than products employing blue light emitting diodes. Accordingly, various studies have been conducted to develop a light emitting diode package having a reduced size and an efficient heat dissipation structure.

For example, in a chip-on-board (COB) type light emitting diode package, a light emitting diode chip is directly mounted on a printed circuit board to reduce a heat discharge path from the light emitting diode chip, thereby improving heat dissipation efficiency while achieving size reduction through height reduction of the light emitting diode package.

Therefore, various studies have been conducted to develop a chip-on-board type light emitting diode package capable of efficiently dissipating heat from a light emitting diode chip.

On the other hand, since such a chip-on-board type UV light emitting diode package requires a connector for connection to a power source and is often connected to an external apparatus such as a curing apparatus, there is a need for studies with respect to the structure of the light emitting diode package.

DISCLOSURE

Technical Problem

Exemplary embodiments of the present invention provide a chip-on-board type light emitting diode package capable of efficiently dissipating heat from a light emitting diode chip.

Technical Solution

In accordance with one embodiment of the present invention, a light emitting diode package includes: a substrate having at least one first pad, at least one second pad, a first terminal and a second terminal formed thereon; a plurality of light emitting diode chips mounted on the at least one first pad and electrically connected to the first pad and the second pad; and a reflector coupled to an upper portion of the substrate and having an opening exposing the plurality of light emitting diode chips, wherein the first pad is integrally formed with the substrate and the first terminal or the second terminal is connected to an external power source and formed to a constant height on an upper surface of the substrate.

In accordance with another embodiment of the present invention, a light emitting diode package includes: a substrate having at least one first pad and at least one second pad formed on an upper surface thereof; a plurality of light emitting diode chips electrically connected to the at least one first pad and the at least one second pad; a reflector coupled to an upper portion of the substrate and having an opening exposing the plurality of light emitting diode chips; and at least one device mounted on the upper portion of the substrate to be placed outside the reflector, wherein the reflector has a recess indented on a side surface toward the opening, and the plurality of light emitting diode chips is mounted on the at least one first pad.

Advantageous Effects

According to exemplary embodiments, an array of plural light emitting diode chips is directly mounted on a substrate and a reflector is disposed to surround the plurality of light emitting diode chips such that the plurality of light emitting diode chips can be protected by the reflector.

BEST MODE

Figure 1:
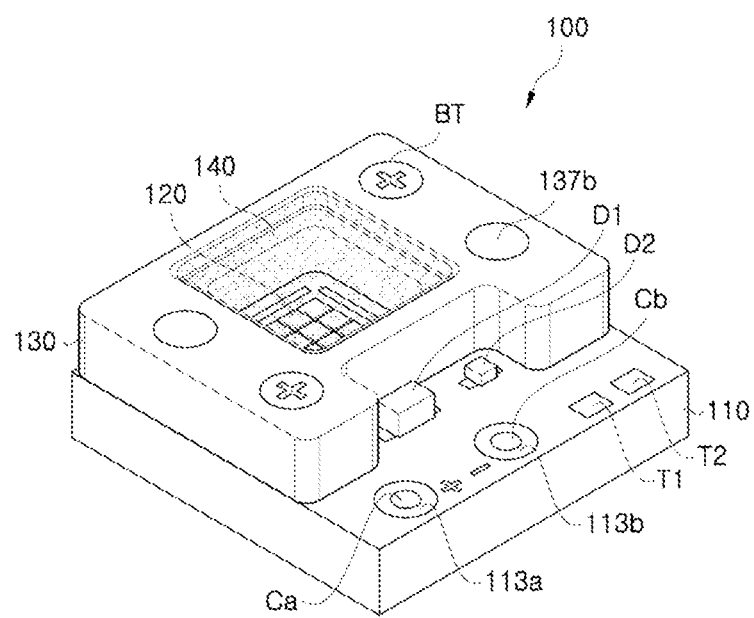
FIG. 1 is a perspective view of a light emitting diode package according to a first embodiment of the present invention.

In accordance with one embodiment of the present invention, a light emitting diode package includes: a substrate having at least one first pad, at least one second pad, a first terminal and a second terminal formed on an upper surface thereof; a plurality of light emitting diode chips mounted on the at least one first pad and electrically connected to the first pad and the second pad; and a reflector coupled to the upper surface of the substrate and having an opening exposing the plurality of light emitting diode chips, wherein the first pad is integrally formed with the substrate and the first terminal or the second terminal is connected to an external power source and formed to a constant height on the upper surface of the substrate.

The first pad may protrude from the substrate and may be formed of the same material as the substrate.

The first terminal and the second terminal may be connected to an external connector.

The substrate may include a body; at least one first pad formed on a portion of the body; a first insulating portion covering the upper surface of the body excluding the first pad; at least one second pad formed on an upper surface of the first insulating portion; and a second insulating portion disposed between the at least one first pad and the at least one second pad and covering the first insulating portion.

The substrate may further include a first terminal formed on the upper surface of the body; and a second terminal formed on the upper surface of the first insulating portion, the second insulating portion may be disposed between the first terminal and the second terminal, and the first terminal may be integrally formed with the body.

The substrate may be formed with a first connector hole and a second connector hole through which external connectors are electrically connected to the first terminal and the second terminal, respectively. The external connectors may be coupled to the first connector hole and the second connector hole by bolts, respectively.

The second terminal may be disposed farther from the reflector than the first terminal.

The substrate may further include a third insulating portion disposed on an inner surface of the second connector hole.

The body may include a metal.

The substrate comprises a plurality of first pads spaced apart from each other and the second insulating portion may be disposed between the first pads separated from each other.

The plural light emitting diode chips may be mounted on the plural first pads, respectively.

The light emitting diode package may further include at least one device mounted on the substrate, wherein the reflector has a protection indentation formed on one side surface thereof to surround at least part of the at least one device.

The at least one device may be disposed between the first pad and the first terminal.

The protection indentation may be formed between at least two protrusions on the side surface of the reflector and may be formed to surround at least two side surfaces of the at least one device.

Each of the substrate and the reflector may be formed with at least one hole extending from an upper surface thereof to a lower surface thereof, and the at least one hole of the substrate may be connected to the at least one hole of the reflector.

The light emitting diode package may further include a coupling portion coupling the substrate to the reflector through the at least one hole of each of the substrate and the reflector.

The light emitting diode package may further include a third insulating portion formed on an inner surface of the at least one hole formed in the substrate.

The reflector may be formed with a mounting recess placed above the opening and having a greater width than the opening, and the light emitting diode package may further include a lens inserted into the mounting recess and transmitting light emitted from the light emitting diode chip.

The reflector may be formed with at least one installation groove at one side of the mounting recess.

The reflector may include at least one vent formed on an inner surface of the mounting recess and extending from the opening. The vent may be open at one side thereof towards an inner surface of the opening and may have the other side extending outside the lens.

The inner surface of the opening may be a slanted surface.

The reflector may include a metal.

In accordance with another embodiment of the present invention, a light emitting diode package includes: a substrate having at least one first pad and at least one second pad formed on an upper surface thereof; a plurality of light emitting diode chips electrically connected to the at least one first pad and the at least one second pad; a reflector coupled to the upper surface of the substrate and having an opening exposing the plurality of light emitting diode chips; and at least one device mounted on the substrate to be placed outside the reflector, wherein the reflector may have an indentation formed on a portion of a side surface thereof towards the opening and the plurality of light emitting diode chips is mounted on the at least one first pad.

At least one device may be at least partially surrounded by the indentation.

According to embodiments of the present invention, in a chip-on-board type light emitting diode package in which the light emitting diode chips are directly mounted on the substrate, the first pads for mounting the light emitting diode chips thereon are integrally formed with the substrate, thereby enabling efficient dissipation of heat from the light emitting diode chips through the substrate.

Furthermore, the first terminal and the second terminal are formed to the same height to allow easy connection of an external connector to the light emitting diode package while reducing failure due to a height difference upon connection of the external connector.

Exemplary embodiments of the present invention will be described in more detail with reference to the accompanying drawings.

Figure 2:
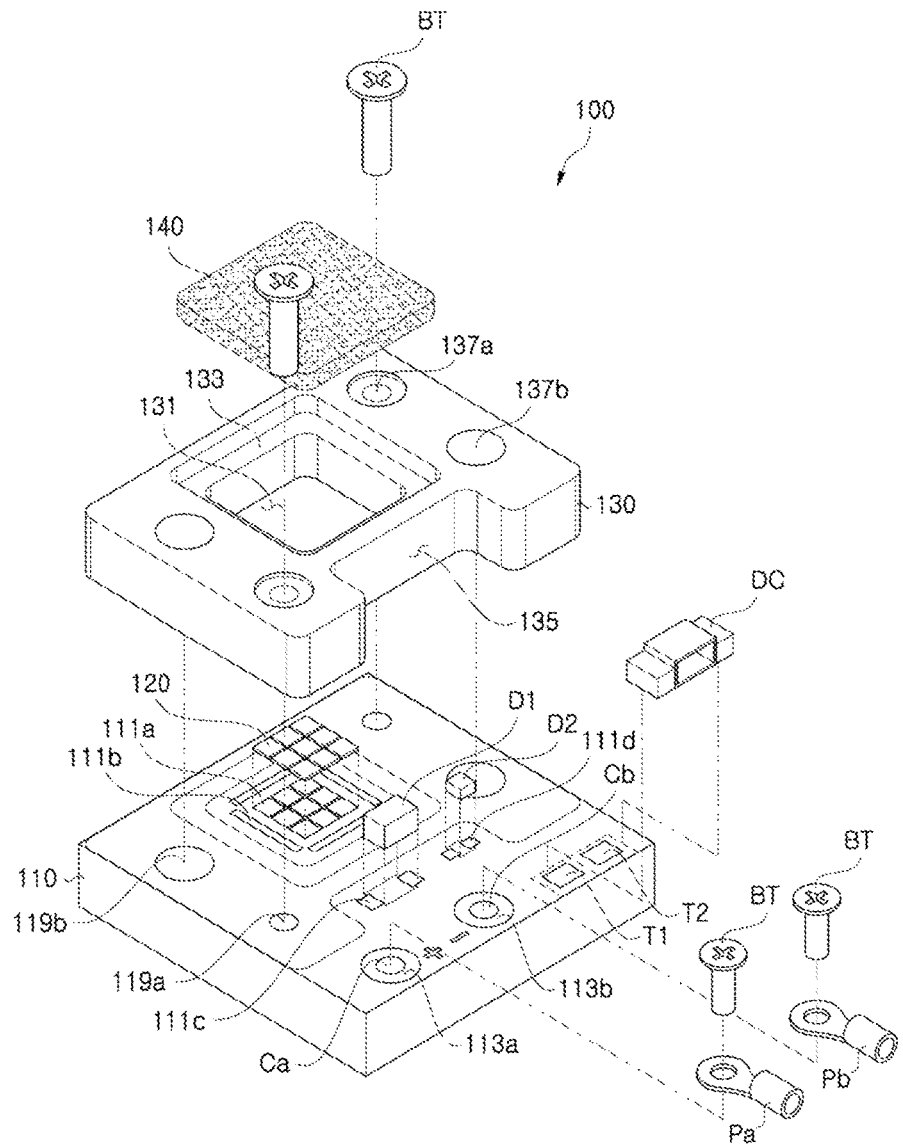
FIG. 2 is an exploded perspective view of the light emitting diode package according to the first embodiment of the present invention.
Figure 3:
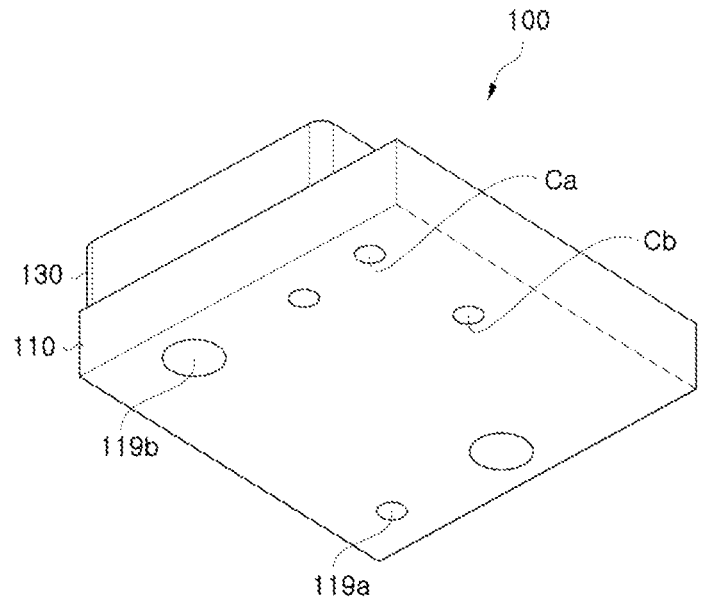
FIG. 3 is a rear perspective view of the light emitting diode package according to the first embodiment of the present invention.
Figure 4:
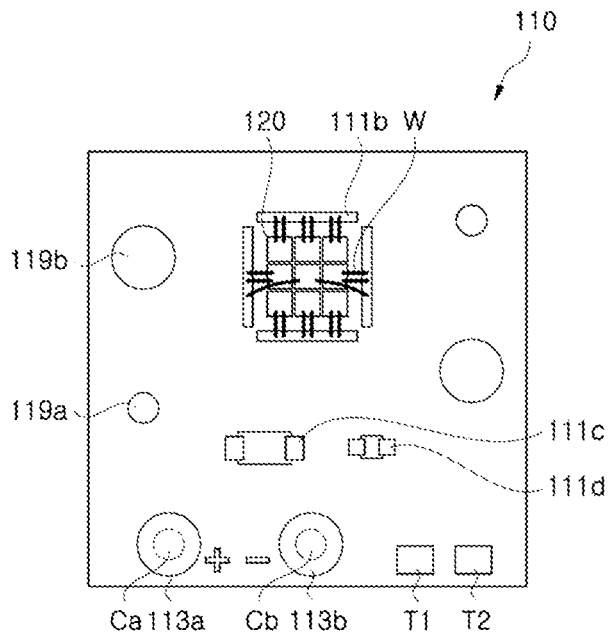
FIG. 4 is a plan view of a substrate of the light emitting diode package according to the first embodiment of the present invention.

FIG. 1 is a perspective view of a light emitting diode package according to a first embodiment of the present invention and FIG. 2 is an exploded perspective view of the light emitting diode package according to the first embodiment of the present invention. FIG. 3 is a rear perspective view of the light emitting diode package according to the first embodiment of the present invention and FIG. 4 is a plan view of a substrate of the light emitting diode package according to the first embodiment of the present invention.

Referring to FIG. 1 to FIG. 4, the light emitting diode package 100 according to the first embodiment includes a substrate 110, light emitting diode chips 120, a reflector 130, and a lens 140.

One or more light emitting diode chips 120 and first and second devices D1, D2 may be mounted on the substrate 110. In addition, the reflector 130 may also be mounted on the substrate 110 to reflect light emitted from the light emitting diode chips 120 mounted on the substrate 110.

The substrate 110 is formed with first pads (cathodes) 111a on which the light emitting diode chips 120 are mounted. In addition, second pads (anodes) 111b may be formed outside the first pads 111a to be electrically connected to the light emitting diode chips 120. A first terminal 113a and a second terminal 113b may be placed at one side of the first pads 111a such that external power connectors can be connected to the first and second terminals. Further, third and fourth pads 111c, 111d may be disposed between the first pads 111a and the first and second terminals 113a, 113b such that the first and second devices D1, D2 are mounted on the third and fourth pads 111c, 111d, respectively. Further, the substrate 110 may be formed with terminals T1, T2, to which device connectors DC are connected to supply power to the first and second devices D1, D2.

The first pads 111a are provided to mount the light emitting diode chips 120 thereon and the number of first pads 111a may be the same as the number of light emitting diode chips 120 mounted on the substrate 110. In this embodiment, 9 first pads 111a are formed on the substrate, as shown in FIG. 2 and FIG. 4. The plural first pads 111a may be regularly arranged in rows and columns. The light emitting diode chip 120 may be mounted on each of the first pads 111a.

The second pad 111b may be disposed outside the plural first pads 111a and may be electrically connected to the light emitting diode chip 120 through wires W. The second pad 111b may also be provided in plural. For example, 4 second pads 111b may be disposed outside the first pads 111a so as to surround the plural first pads 111a.

The light emitting diode chips 120 disposed on the first pads 111a may be electrically connected to the second pads 111b by wires W. As shown in FIG. 4, among 9 light emitting diode chips disposed on the first pads 111a, respectively, 8 light emitting diode chips 120 disposed around a central light emitting diode chip 120 are electrically connected to the second pads 111b by the wires W, respectively, and the central light emitting diode chip 120 is electrically connected to the second pads 111b at both sides thereof by the wires W.

The first terminal 113a and the second terminal 113b are disposed at one side of the substrate 110 and serve to supply power to the light emitting diode chips 120. In addition, the first terminal 113a and the second terminal 113b may be electrically connected to external power connectors, such as a first compression terminal Pa and a second compression terminal Pb. In this embodiment, the first terminal 113a may be electrically connected to the first pads 111a through a body 110a of the substrate 110 described below. In addition, the second terminal 113b may be electrically connected to the second pads 111b through electrically conductive lines formed on the substrate 110 in the same way as a printed circuit board.

In this embodiment, the substrate 110 may have a first connector hole Ca and a second connector hole Cb formed corresponding to the first terminal 113a and the second terminal 113b, respectively. Bolts BT may be inserted into and coupled to the first connector hole Ca and the second connector hole Cb, respectively. To this end, each of the first and second connector holes Ca, Cb may have threads formed on an inner sidewall thereof. Further, each of the first connector hole Ca and the second connector hole Cb may be formed through the substrate 110.

Accordingly, as shown in FIG. 2, with the first compression terminal Pa and the second compression terminal Pb electrically contacting the first terminal 113a and the second terminal 113b, respectively, the bolts BT are coupled to the first connector hole Ca and the second connector hole Cb through the first compression terminal Pa and the second compression terminal Pb, whereby the first compression terminal Pa and the second compression terminal Pb can be coupled to the first terminal 113a and the second terminal 113b, respectively.

Each of the first compression terminal Pa and the second compression terminal Pb may include a conductive metal and may be formed at one side thereof with a hole through which a bolt BT passes. In addition, the other side of each of the first and second compression terminals Pa, Pb may have a hollow pipe shape such that an electric wire can be connected thereto. Accordingly, the first compression terminal Pa and the second compression terminal Pb may be coupled to the first terminal 113a and the second terminal 113b such that power can be supplied to the light emitting diode chips 120 through the first terminal 113a and the second terminal 113b.

Further, the substrate 110 may be formed with first substrate holes 119a and second substrate holes 119b. Specifically, the substrate 110 may include at least two first substrate holes 119a and at least two second substrate holes 119b. Each of the first substrate holes 119a may be formed to allow a bolt BT to be coupled thereto such that the reflector 130 can be more firmly coupled to the substrate 110 upon coupling of the reflector 130 to an upper side of the substrate 110. Here, the first substrate holes 119a may be formed therein with threads such that the bolt BT can be coupled thereto.

Each of the second substrate holes 119b is formed to allow a bolt BT to pass therethrough such that the light emitting diode package 100 can be coupled to an external device by the bolt BT. Like the first substrate holes 119a, the second substrate holes 119b may also have threads, as needed.

According to this embodiment, each of the first substrate holes 119a and the second substrate holes 119b may be formed through the substrate 110 to extend from an upper surface thereof to a lower surface thereof, as shown in FIG. 2 and FIG. 3. Although the second substrate holes 119b are shown as having a larger diameter than the first substrate hole 119a, it should be understood that the present invention is not limited thereto.

The device connector DC is coupled to the third and fourth terminals T1, T2 to supply external power to the second device D2. When the device connector DC is coupled to the third and fourth terminals T1, T2, the height of the device connector DC may be smaller than the thickness of the reflector 130. With this structure, the device connector DC can minimize interference upon coupling of the light emitting diode package 100 to an external device and can decrease an irradiation distance to an object with light emitted from the light emitting diode chips 120.

Each of the light emitting diode chips 120 is mounted on the first pad 111a formed on the upper surface of the substrate 110 to be electrically connected thereto. As described above, the plural light emitting diode chips 120 may be mounted on the plural first pads 111a, respectively. In addition, each of the light emitting diode chips 120 may be coupled to the corresponding first pad 111a by Ag pastes, which are resistant to heat. Here, since the plural light emitting diode chips 120 are mounted on the plural first pads 111a, respectively, the plural light emitting diode chips 120 can be disposed at accurate locations on the plural first pads 111a.

The reflector 130 is coupled to the upper surface of the substrate 110 and may be formed at the center thereof with an opening 131 so as to expose the light emitting diode chips 120 mounted on the first pads 111a and the second pads 111b. In this embodiment, the opening 131 has a rectangular shape in plan view. However, it should be noted that the present invention is not limited thereto and the shape of the opening 131 can be changed into various shapes depending upon the mounting shape of the light emitting diode chips 120.

The lens 140 may be mounted at a location on the reflector 130 corresponding to the opening 131. To this end, the reflector 130 may be formed with a mounting recess 133 at an upper portion of the opening 131 such that a step is formed between the mounting recess 133 and an upper surface of the reflector 130.

In addition, the reflector 130 may be formed with at least one first coupling hole 127a and at least one second coupling hole 137b, which pass through the reflector 130 from an upper surface thereof to a lower surface thereof. The first coupling hole 137a and the second coupling hole 137b may be formed at locations of the reflector 130 corresponding to the first substrate hole 119a and the second substrate hole 119b, and may have the same diameters as the first substrate hole 119a and the second substrate hole 119b, respectively. Specifically, when the reflector 130 is coupled to the substrate 110, the first coupling hole 137a may be placed at the same location as the first substrate hole 119a and the second coupling hole 137b may be placed at the same location as the second substrate hole 119b. Here, the upper surface of the reflector 130 has a predetermined area so as to allow the first and second coupling holes 137a, 137b to be formed thereon.

As shown in FIG. 1 and FIG. 2, the reflector 130 has a protection indentation 135 formed on one side surface thereof. The protection indentation 135 may have a shape in which the side surface of the reflector 130 is partially indented towards the opening 131. That is, the protection indentation 135 may be disposed between protrusions at both sides of the side surface of the reflector 130. When the reflector 130 is mounted on the substrate 110, the first and second devices D1, D2 mounted on the substrate 110 are at least partially surrounded by the protection indentation 135 of the reflector 130, so that the reflector 130 can protect at least part of the first and second devices D1, D2 from an external environment.

In this embodiment, the reflector 130 serves to guide light emitted from the light emitting diode chips 120 disposed inside the opening 131 to travel in an upward direction while protecting the light emitting diode chips 120 disposed inside the opening 131.

The reflector 130 may include a metal, whereby heat generated from the light emitting diode chips 120 can be transferred to the reflector 130 through the substrate 110 and then discharged to the outside.

The reflector 130 may have a coating formed on an outer surface thereof by anodizing and thus may have a black outer surface.

The lens 140 is coupled to the reflector 130 by inserting the lens 140 into the mounting recess 133 of the reflector 130. Thus, the lens 140 may have a larger area than the opening 131. In addition, the lens 140 may have a flat upper surface, without being limited thereto. The lens 140 may be formed of glass or the like and may contain at least one type of phosphor dispersed therein.

Figure 5:
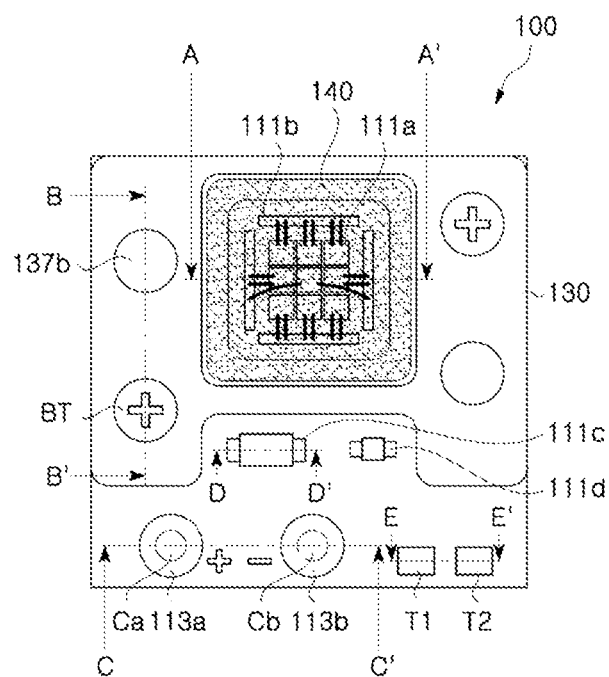
FIG. 5 is a plan view of the light emitting diode package according to the first embodiment of the present invention.
Figure 6:
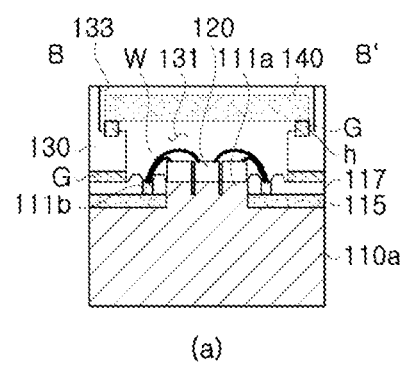
FIG. 6 is cross-sectional views taken along lines of FIG. 5.
Figure 6:
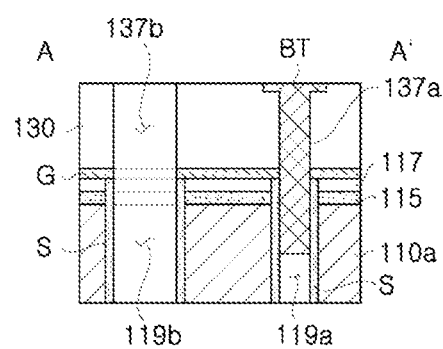
Figure 6:
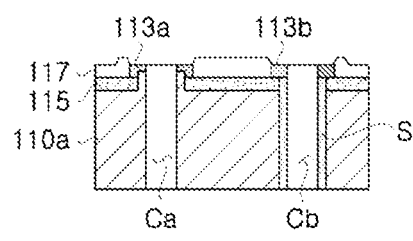
Figure 6:
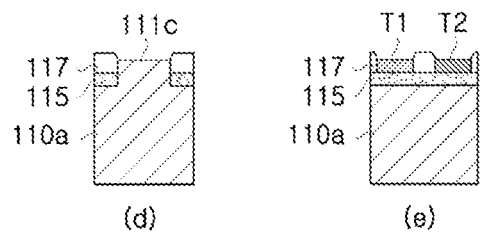

FIG. 5 is plan view of the light emitting diode package according to the first embodiment of the present invention. In FIG. 6, (a) is a cross-sectional view taken along line A-A' of FIG. 5, (b) is a cross-sectional view taken along line B-B' of FIG. 5, and (c) is a cross-sectional view taken along line C-C' of FIG. 5. In addition, in FIG. 6, (d) is a cross-sectional view taken along line D-D' of FIG. 5 and (e) is a cross-sectional view taken along line E-E' of FIG. 5.

Referring to FIG. 5 and FIG. 6, a coupling relationship between the substrate 110, the light emitting diode chips 120, the reflector 130 and the lens 140 will be described in more detail.

FIG. 6(a) is a cross-sectional view illustrating the light emitting diode chips 120 of FIG. 5. Referring to FIG. 6(a), the substrate 110 includes the body 110a, the first pads 111a, the second pads 111b, a first insulating portion 115, and a second insulating portion 117.

The body 110a may include a metal, for example, copper (Cu). The body 110a may have a flat upper surface. Here, the first pads 111a may protrude from a portion of the body 110a such that the light emitting diode chips 120 can be mounted thereon. As such, the structure of the first pads 111a integrally formed with the body 110a allows heat to be immediately transferred to the body 110a through the first pads 111a when generated from the light emitting diode chips 120 mounted on the first pads 111a, thereby enabling more rapid heat dissipation.

The first insulating portion 115 covers substantially the entirety of the upper surface of the body 110a of the substrate 110 excluding the first pads 111a, as shown in FIG. 6(a). In addition, as described below, the first insulating portion 115 is formed not only on the first pad 111a, but also on the first terminal 113a, the first substrate hole 119a, the second substrate hole 119b, and the second connector hole Cb.

The second pads 111b are disposed near the first pads 111a on the first insulating portion 115 to be spaced apart from the first pads 111a. As shown in the drawings, the second pads 111b are disposed at both sides of the first pads 111a and may be electrically connected to the light emitting diode chips 120 by wires W. The second pads 111b may have the same height as the first pads 111a.

In this embodiment, Ni/Au, Ni/Ag, or Ni/Pd/Au may be deposited on an upper surface of each of the first and second pads 111a, 111b.

The second insulating portion 117 covers the first insulating portion 115 and may be disposed between the first pad 111a, the second pad 111b, the first terminal 113a and the second terminal 113b. The second insulating portion 117 may be disposed between the first pad 111a and the second pad 111b to prevent electric short circuit between the first pad 111a and the second pad 111b. Here, the second insulating portion 117 may cover part of each of the first pads 111a and the second pads 111b.

As described above, even in the structure wherein the second insulating portion 117 partially covers the first pads 111a, the second pads 111b, the first terminal 113a and the second terminal 113b, the overall height of the second insulating portion 117 may be the same as the first pads 111a, the second pads 111b, the first terminal 113a and the second terminal 113b.

The reflector 130 may be mounted on the substrate 110 and coupled to the substrate 110 by a bonding portion G. The bonding portion G may be formed on the reflector 130 and the substrate 110 by depositing a bonding agent on the substrate 110 and the reflector 130 excluding the first coupling hole 137a and the second coupling hole 137b.

With the reflector 130 bonded to the substrate 110 by the bonding portion G, as described above, the reflector 130 and the substrate 110 may be recoupled to each other by a bolt BT. When the reflector 130 is normally placed on the substrate 110, the first coupling hole 137a of the reflector 130 is connected to the first substrate hole 119a of the substrate 110 to form a single hole such that the bolt BT can recouple the reflector 130 to the substrate 110 through the first coupling hole 137a and the first substrate hole 119a. The structure of recoupling the reflector 130 to the substrate using the bolt BT prevents the reflector 130 from being separated from the substrate 110 even when bonding strength of the bonding portion G decreases due to heat generated from the light emitting diode chips 120. Here, the bonding portion G may include a material capable of efficiently transferring heat from the substrate 110 to the reflector 130.

The lens 140 is mounted on the mounting recess 133 of the reflector 130. Here, the lens 140 may be coupled to the mounting recess 133 by the bonding portion G. The bonding portion G may be deposited on an inner lower surface of the mounting recess 133 of the reflector 130. Here, a bonding groove h may be formed on the inner lower surface of the mounting recess 133 on which the bonding portion G is deposited. The bonding groove h may be filled with the bonding portion G to increase a contact area between the bonding portion G and the reflector 130.

FIG. 6(b) is a cross-sectional view illustrating the first coupling hole 137a and the second coupling hole 137b of the reflector 130.

Referring to FIG. 6(b), the reflector 130 is coupled to the upper surface of the substrate 110 by the bonding portion G and is recoupled thereto by the bolt BT, which penetrates the first coupling hole 137a and the first substrate hole 119a. Here, a third insulating portion S may be formed on an inner surface of each of the first substrate hole 119a and the second substrate hole 119b formed in the substrate 110. Accordingly, with the third insulating portion S formed therein, the first substrate hole 119a and the second substrate hole 119b may have the same diameters as the first coupling hole 137a and the second coupling hole 137b of the reflector 130, respectively. In addition, the threads on each of the first substrate hole 119a and the second substrate hole 119b may be formed on the third insulating portion S.

As such, since the third insulating portion S is formed on the inner surface of each of the first substrate hole 119a and the second substrate hole 119b, the bolts BT can be electrically insulated from the body 110a of the substrate 110 even when the bolts BT are fastened to the first substrate hole 119a and the second substrate hole 119b. Accordingly, when electric power is applied to the body 110a of the substrate 110 through the first terminal 113a, the electric power cannot be applied to the reflector 130 through the bolts BT formed of a metallic material. Here, the bolts BT may be formed of an insulating material.

Although the third insulating portion S is shown as being formed over the inner surface of each of the first substrate hole 119a and the second substrate hole 119b of the substrate 110, the third insulating portion S may not be formed on the first insulating portion 115 and the second insulating portion 117, as needed.

FIG. 6(c) is a cross-sectional view illustrating the first terminal 113a and the second terminal 113b.

First, the body 110a of the substrate 110 protrudes upwards at a location of the first terminal 113a. In addition, the first connector hole Ca is formed through the protrusion of the body 110a in the vertical direction. Further, the first insulating portion 115 is formed on the upper surface of the body 110a around the protrusion of the body 110a and the first terminal 113a is disposed to cover a portion of the first insulating portion 115 and an upper surface of the protrusion of the body 110a. With this structure, the first terminal 113a can be electrically connected to the protrusion of the body 110a.

Next, at a location of the second terminal 113b, the second connector hole Cb is formed in the body 110a of the substrate 110 and the third insulating portion S is formed on the inner surface of the second connector hole Cb. The third insulating portion S may also be formed on an upper surface of the first insulating portion 115. As such, the second terminal 113b is disposed on a portion of the first insulating portion 115 and the upper surface of the third insulating portion S and may have a shape surrounding the second connector hole Cb. Accordingly, even when a metallic bolt BT is inserted into the second connector hole Cb, the second terminal 113b can be insulated from the body 110a of the substrate 110.

In addition, threads may be formed on the inner surface of each of the first connector hole Ca and the second connector hole Cb such that bolts BT can be fastened to the first and second connection holes.

Further, the second insulating portion 117 may be disposed to cover the first insulating portion 115 and part of each of the first terminal 113a and the second terminal 113b. In addition, the second insulating portion 117 is disposed between the first terminal 113a and the second terminal 113b to prevent short circuit between the first terminal 113a and the second terminal 113b.

Each of the first terminal 113a and the second terminal 113b may include Cu/Ni/Au or Cu/Ni/Pd/Au.

FIG. 6(d) is a cross-sectional view illustrating a third pad 111c to which the first device D1 is coupled.

Referring to FIG. 6(d), like the first pad 111a, the third pad 111c may protrude from the upper surface of the body 110a of the substrate 110. The first insulating portion 115 may be formed to cover the upper surface of the body 110a around the third pad 111c protruding upwards, and the second insulating portion 117 may be formed to cover a portion of the third pad 111c on the upper surface of the first insulating portion 115.

FIG. 6(e) is a cross-sectional view illustrating a third terminal T1 and a fourth terminal T2.

The first insulating portion 115 is disposed on the body 110a of the substrate 110, and the third terminal T1 and the fourth terminal T2 are disposed on the first insulating portion 115. The third terminal T1 is spaced apart from the fourth terminal T2 and the second insulating portion 117 may be disposed between the third terminal T1 and the fourth terminal T2.

Although not shown in the drawings, a fourth pad 111d for mounting the second device D2 may also have the same cross-sectional shape as the third terminal T1 and the fourth terminal T2.

Figure 7:
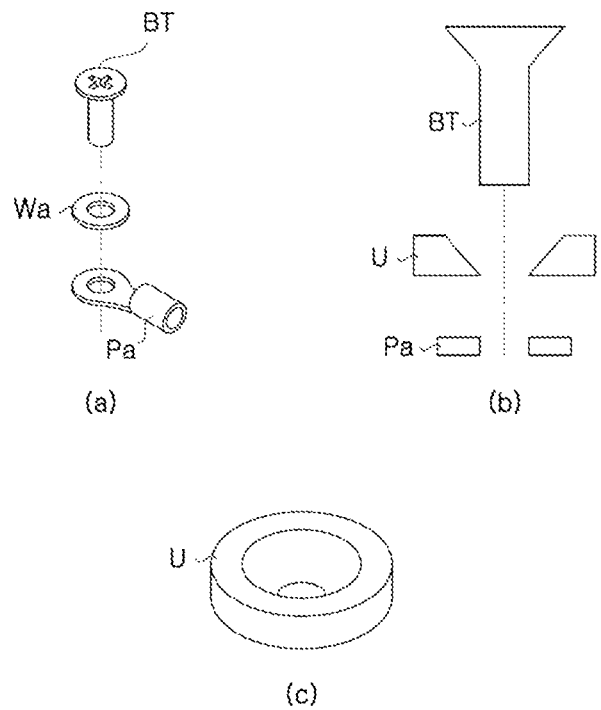
FIG. 7 shows a bolt, which connects an external power connector to the light emitting diode package according to the first embodiment of the present invention.

FIG. 7 shows a bolt BT, which connects an external power connector to the light emitting diode package according to the first embodiment of the present invention.

Referring to FIG. 2, in the first embodiment, the first compression terminal Pa and the second compression terminal Pb are coupled to the first terminal 113a and the second terminal 113b by bolts BT, respectively. Each of the first compression terminal Pa and the second compression terminal Pb may be formed with a hole such that the bolt BT can be inserted into the first and second compression terminals.

As shown in FIG. 7(a), at least one washer Wa may be disposed on the hole of the first compression terminal Pa. Accordingly, even when the bolt BT has a greater length than the substrate 110, the bolt BT does not protrude from a lower surface of the substrate 110.

Although each of the first connector hole Ca and the second connector hole Cb is shown as a hole penetrating the body 110a of the substrate 110 in FIG. 6(c), the first connector hole Ca and the second connector hole Cb may have a blind-hole shape. Accordingly, even when the bolt BT has a greater length than the first connector hole Ca and the second connector hole Cb, the length of the bolt BT can be adjusted using a washer Wa.

In addition, when a bolt BT having a slanted head is used as shown in FIG. 7(b), a support capable of supporting a slanted portion of the head of the bolt BT may be used. As shown in FIG. 7(c), the support U may have a slanted portion formed on an inner hole thereof corresponding to the slanted portion of the head of the bolt BT. The support U may be formed of a ceramic material, a plastic material, or a metallic material such as thin aluminum foil.

In this embodiment, the washer Wa and the support U may also be applied to other portions at which bolts BT are used, as needed.

Figure 8:
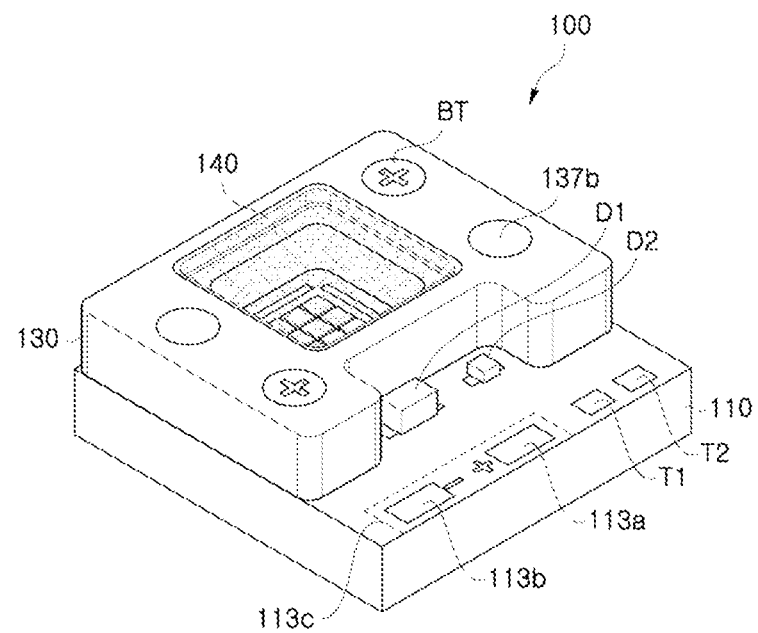
FIG. 8 is a perspective view of a light emitting diode package according to a second embodiment of the present invention.
Figure 9:
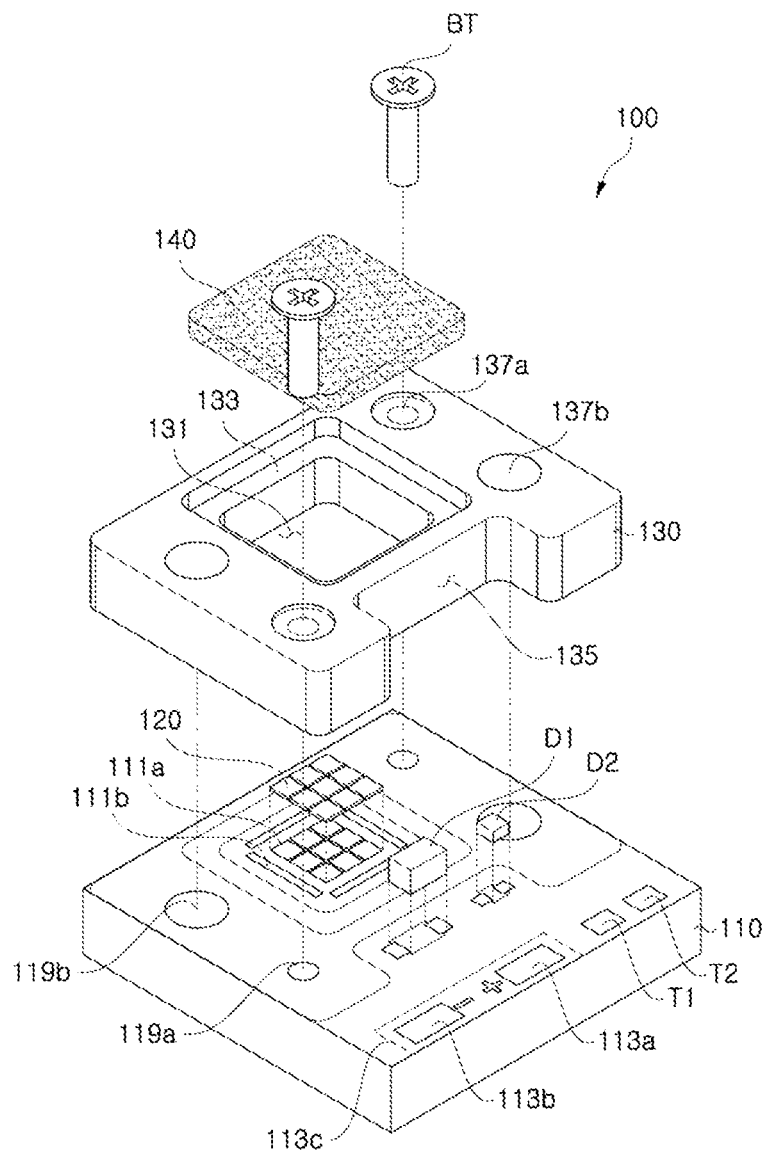
FIG. 9 is an exploded perspective view of the light emitting diode package according to the second embodiment of the present invention.
Figure 10:
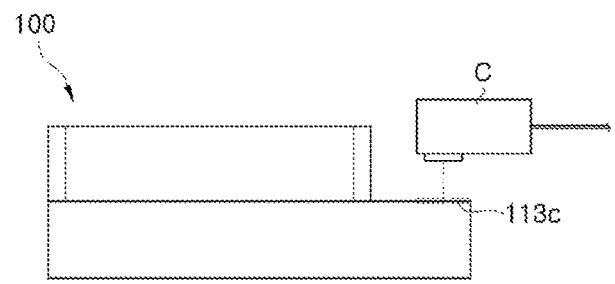
FIG. 10 is a side view illustrating connection of an external power connector to the light emitting diode package according to the second embodiment of the present invention.

FIG. 8 is a perspective view of a light emitting diode package according to a second embodiment of the present invention and FIG. 9 is an exploded perspective view of the light emitting diode package according to the second embodiment of the present invention. FIG. 10 is a side view illustrating connection of an external power connector to the light emitting diode package according to the second embodiment of the present invention.

Referring to FIG. 8 and FIG. 9, the light emitting diode package 100 according to the second embodiment includes a substrate 110, light emitting diode chips 120, a reflector 130, and a lens 140. Descriptions of the same components as those of the first embodiment will be omitted.

In the light emitting diode package 100 according to this embodiment, a first terminal 113a and a second terminal 113b may be electrically connected to an external power connector, such as a connector C.

The first terminal 113a is electrically connected to first pads 111a and the second terminal 113b is electrically connected to second pads 111b. The first terminal 113a may be electrically connected to the first pads 111a through a body 110a of the substrate 110 and the second terminal 113b may be electrically connected to the second pads 111b through electrically conductive lines formed on the substrate 110.

According to this embodiment, the first terminal 113a may protrude from the body 110a of the substrate 110 and the second terminal 113b may be formed on a first insulating portion 115, like the first pads 111a and the second pads 111b according to the first embodiment. In addition, the first terminal 113a may have the same height as the second terminal 113b. Further, a second insulating portion 117 is formed between the first terminal 113a and the second terminal 113b to electrically insulate the first terminal 113a from the second terminal 113b.

Referring to FIG. 10, in order to connect an external power source to the first terminal 113a and the second terminal 113b, a connector C for the external power source may be brought into contact with the first terminal 113a and the second terminal 113b. In order to allow easy connection of the connector C of the external power source to the first terminal 113a and the second terminal 113b by covering the first terminal 113a and the second terminal 113b, a region 113c including the first terminal 113a and the second terminal 113b may be marked on the substrate 110.

According to this embodiment, the upper surface of the substrate 110 having the first terminal 113a and the second terminal 113b formed thereon has a substantially flat shape. Accordingly, a connector having terminals formed on a flat surface can be electrically connected to the first terminal 113a and the second terminal 113b, whereby the light emitting diode package 100 can be firmly coupled to the connector C.

Figure 11:
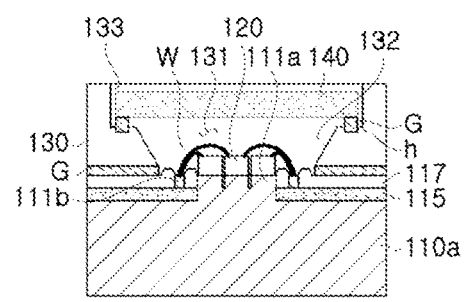
FIG. 11 is a cross-sectional view illustrating an opening of a reflector of a light emitting diode package according to a third embodiment of the present invention.

FIG. 11 is a sectional view illustrating an opening of a reflector of a light emitting diode package according to a third embodiment of the present invention.

Referring to FIG. 11, the light emitting diode package 100 according to the third embodiment includes a substrate 110, light emitting diode chips 120, a reflector 130, and a lens 140. Descriptions of the same components as those of the first embodiment will be omitted.

According to this embodiment, an inner surface of the opening 131 formed in the reflector 130 is a slanted surface 132. Accordingly, when light emitted from the light emitting diode chips 120 is discharged through the opening 131 of the reflector 130 mounted on the substrate 110, the light is discharged after being reflected by the slanted surface 132 of the opening 131, thereby improving light discharge efficiency. Here, the opening 131 may be defined as an open region under the mounting recess 133 on which the lens 140 is mounted. By way of example, the opening 131 may have a depth of 0.5 mm or 1 mm when the reflector 130 has a thickness of 2 mm. In addition, the slanted surface 132 of the opening 131 may have an inclination angle of about 60 degrees. The depth of the opening 131 and the inclination of the slanted surface 132 can be changed as needed.

Figure 12:
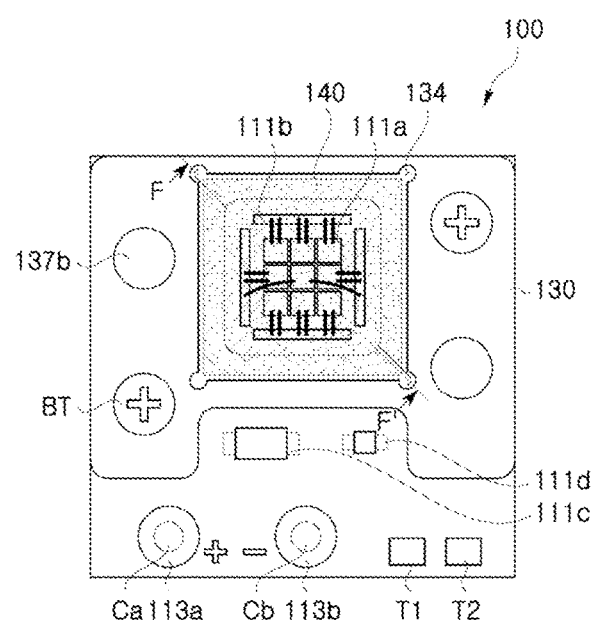
FIG. 12 is a plan view of a light emitting diode package according to a fourth embodiment of the present invention.
Figure 13:
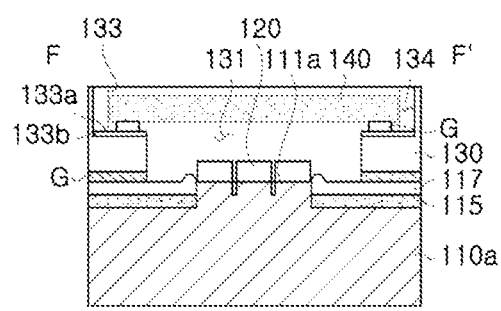
FIG. 13 is a side sectional view taken along line F-F' of FIG. 12.

FIG. 12 is a plan view of a light emitting diode package according to a fourth embodiment of the present invention and FIG. 13 is a cross-sectional view taken along line F-F' of FIG. 12.

Referring to FIG. 12 and FIG. 13, the light emitting diode package 100 according to the fourth embodiment includes a substrate 110, light emitting diode chips 120, a reflector 130, and a lens 140. Descriptions of the same components as those of the first embodiment will be omitted.

In this embodiment, the mounting recess 133 of the reflector 130 may have a rectangular shape in plan view and be formed with installation grooves 134 at four corners of the rectangular shape thereof. In this embodiment, a lens 140 mounted on the mounting recess 133 has a rectangular parallelepiped shape, a corner of which does not have a curved shape. Accordingly, when the lens 140 is mounted on the mounting recess 133 of the reflector 130, the installation grooves 134 serve as spaces for accurate mounting of the lens 140.

Although the reflector 130 is shown as including four installation grooves 134 in this embodiment, the reflector 130 may include two installation grooves 134 disposed in the diagonal direction, as needed.

In addition, although the installation grooves 134 are shown as having a cylindrical shape in this embodiment, it should be understood that the installation grooves 134 may be formed in various shapes.

In this embodiment, the lens 140 mounted on the mounting recess 133 adjoin a mounting surface 133a, which is a lower surface of the mounting recess 133. The mounting surface 133a may be formed with at least one vent 133b, which extends from the opening 131 to the installation groove 134. The vent 133b may be formed on the mounting surface 133a in the longitudinal direction. The vent 133b may have a groove shape that is open at an upper side thereof and also open at one end thereof towards an inner wall of the opening 131.

The other end of the vent 133b extends to the installation groove 134 of the mounting surface 133a. Here, when the lens 140 is mounted on the mounting recess 133, the other end of the vent 133b extending to the installation groove 134 is exposed outside the lens 140. In this embodiment, the vent 133b is formed in the diagonal direction of the reflector 130 such that the other side of the vent 133b extends to the installation groove 134.

The vent 133b serves to prevent expansion of air in the opening 131 due to heat generated from the light emitting diode chips 120 inside the opening 131 and discharged through the substrate 110 and the reflector 130. Accordingly, air heated in the opening 131 can be discharged through the vent 133b, thereby preventing deformation of the light emitting diode package 100 due to expansion of air in the opening 131.

As shown in FIG. 13, the bonding portion G formed on the mounting surface 133a to bond the lens 140 to the mounting surface 133a may not be formed on the vent 133b.

Figure 14:
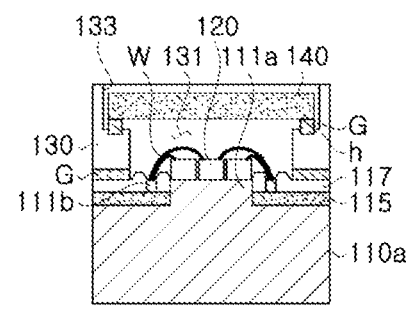
FIG. 14 is a sectional view of a substrate for mounting light emitting diode chips of a light emitting diode package according to a fifth embodiment of the present invention.

FIG. 14 is a sectional view of a substrate for mounting light emitting diode chips of a light emitting diode package according to a fifth embodiment of the present invention.

Referring to FIG. 14, the light emitting diode package 100 according to the fifth embodiment includes a substrate 110, light emitting diode chips 120, a reflector 130, and a lens 140. Descriptions of the same components as those of the first embodiment will be omitted.

In this embodiment, the substrate 110 includes a body 110a, a first pad 111a, a second pad 111b, a first insulating portion 115, and a second insulating portion 117.

The first pad 111a may protrude from an upper surface of the body 110a of the substrate 110 and may be provided singularly. Accordingly, a plurality of light emitting diode chips 120 may be mounted on one first pad 111a. Unlike the first embodiment, the light emitting diode package 100 includes one first pad 111a, on which one or plural light emitting diode chips 120 may be mounted. Thus, it is possible to adjust the number of light emitting diode chips 120 to be mounted on the first pad 111a.

Although some exemplary embodiments have been described herein, it should be understood by those skilled in the art that these exemplary embodiments are given by way of illustration only and the present invention is not limited thereto. In addition, although the exemplary embodiments described herein are provided as separate embodiments, these exemplary embodiments may be combined to provide a separate exemplary embodiment. Therefore, the scope of the present invention should be limited only by the accompanying claims and equivalents thereof.

*List of Reference Numerals

| | |
|---|---|
| 100: light emitting diode package | |
| 110: substrate | 110a: body |
| 111a: first pad | 111b: second pad |
| 111c: third pad | 111d: fourth pad |
| 113a: first terminal | 113b: second terminal |
| 115: first insulating portion | 117: second insulating portion |
| 119a: first substrate hole | 119b: second substrate hole |
| 120: light emitting diode chip | |
| 130: reflector | 131: opening |
| 132: slanted surface | 133: mounting recess |
| 133a: mounting surface | 133b: vent |
| 134: installation groove | 135: protection indentation |
| 137a: first coupling hole | 137b: second coupling hole |
| 140: lens | |
| G: bonding portion | h: bonding groove |
| W: wire | |
| BT: bolt | C: connector |
| Ca: first connector hole | Cb: second connector hole |
| Pa: first compression terminal | Pb: second compression terminal |
| S: third insulating portion | |
| D1: first device | D2: second device |
| T1: third terminal | T4: fourth terminal |

The invention claimed is:

1. A light emitting diode package comprising:
a substrate having at least one first pad, at least one second pad, a first terminal and a second terminal that are formed on the substrate;
a plurality of light emitting diode chips, at least one of the plurality of light emitting diode chips mounted on the at least one first pad, and electrically connected to the first pad and the second pad; and
a reflector coupled to the upper surface of the substrate and having an opening exposing the plurality of light emitting diode chips, wherein the first terminal or the second terminal is connected to an external power source and formed to a constant height on the upper surface of the substrate, wherein the substrate comprises:
a body;
at least one first pad formed on an upper surface of the body;
a first insulating portion covering the upper surface of the body excluding the first pad;
at least one second pad formed on an upper surface of the first insulating portion; and
a second insulating portion disposed between the at least one first pad and the at least one second pad and covering the first insulating portion.

2. The light emitting diode package according to claim 1, wherein the first terminal is formed on the upper surface of the body, the second terminal is formed on the upper surface of the first insulating portion, the second insulating portion is disposed between the first terminal and the second terminal.

3. The light emitting diode package according to claim 2, wherein the substrate is formed with a first connector hole and a second connector hole through which external connectors are electrically connected to the first terminal and the second terminal, respectively.

4. The light emitting diode package according to claim 3, wherein the external connectors are coupled to the first connector hole and the second connector hole by bolts, respectively.

5. The light emitting diode package according to claim 3, wherein the second terminal is disposed farther from the reflector than the first terminal.

6. The light emitting diode package according to claim 3, wherein the substrate further comprises a third insulating portion disposed on an inner surface of the second connector hole.

7. The light emitting diode package according to claim 1, wherein the body comprises a metal.

8. The light emitting diode package according to claim 1, wherein the substrate comprises a plurality of first pads spaced apart from one another and the second insulating portion is disposed between the plurality of first pads spaced apart from one another.

9. The light emitting diode package according to claim 8, wherein each of the plurality of the light emitting diode chips is mounted on a corresponding first pad of the plurality of first pads.

10. The light emitting diode package according to claim 1, further comprising:
at least one device mounted on the substrate,
wherein the reflector has a protection indentation formed on a side surface of the reflector, the reflector surrounding at least part of the at least one device.

11. The light emitting diode package according to claim 10, wherein the at least one device is disposed between the first pad and the first terminal.

12. The light emitting diode package according to claim 10, wherein the protection indentation is formed between at least two protrusions on the side surface of the reflector.

13. The light emitting diode package according to claim 10, wherein the protection indentation is formed to surround at least two side surfaces of the at least one device.

14. The light emitting diode package according to claim 1, further comprising:
a lens inserted into a mounting recess and transmitting light emitted from the light emitting diode chip,
the mounting recess being formed at an upper portion of the opening in the reflector and having a greater width than the opening,
wherein the reflector has at least one vent formed on an inner surface of the mounting recess and extending from the opening.

15. The light emitting diode package according to claim 14, wherein the vent is open at one side thereof towards an inner surface of the opening and has the other side extending toward an outside the lens.

16. A light emitting diode package comprising:
a substrate having at least one first pad and at least one second pad formed on an upper surface of the substrate;
a plurality of light emitting diode chips electrically connected to the at least one first pad and the at least one second pad;
a reflector coupled to the upper surface of the substrate and having an opening exposing the plurality of light emitting diode chips; and
at least one device mounted on the substrate to be placed outside the reflector, and
wherein the reflector has an indentation formed on a portion of a side surface of the reflector towards the opening and the plurality of light emitting diode chips are mounted on the at least one first pad, and wherein the at least one device is at least partially surrounded by the indentation.

17. The light emitting diode package of claim 16, the substrate includes a terminal formed on an upper surface of the substrate, the terminal electrically connected to an external connector.

18. The light emitting diode package of claim 16, further comprising a lens disposed to cover the opening of the reflector.

19. The light emitting diode package of claim 16, wherein the reflector includes a metal.

* * * * *